US009651374B1

(12) United States Patent
Wingo et al.

(10) Patent No.: US 9,651,374 B1
(45) Date of Patent: May 16, 2017

(54) METHOD AND SYSTEM FOR MEASURING PHYSICAL PHENOMENA IN AN OPEN WATER ENVIRONMENT

(71) Applicants: Robert Andrew Wingo, Manassas, VA (US); John J. Holmes, Columbia, MD (US); William A. Venezia, Stuart, FL (US)

(72) Inventors: Robert Andrew Wingo, Manassas, VA (US); John J. Holmes, Columbia, MD (US); William A. Venezia, Stuart, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 181 days.

(21) Appl. No.: 14/677,428

(22) Filed: Apr. 2, 2015

Related U.S. Application Data

(60) Provisional application No. 61/976,161, filed on Apr. 7, 2014.

(51) Int. Cl.
*G01C 13/00* (2006.01)
*B63B 22/06* (2006.01)
(Continued)

(52) U.S. Cl.
CPC ............ *G01C 13/00* (2013.01); *B63B 22/06* (2013.01); *B63B 27/10* (2013.01); *G01L 9/00* (2013.01);
(Continued)

(58) Field of Classification Search
CPC ......... G01C 13/00; B63B 22/04; B63B 22/06; G01L 9/00; G01P 15/00; G01R 33/02; G01S 1/72
See application file for complete search history.

(56) References Cited

U.S. PATENT DOCUMENTS 4,138,752 A     2/1979   Dickson
4,631,956 A * 12/1986   Walden .................... B64D 1/02
                                                                441/25
(Continued)

OTHER PUBLICATIONS

H.O. Berteaux, S.M. Kery, R.G. Walden, "Self Deployable Deep Sea Moorings." Technical Report, WHOI-92-08, Wood Hole Oceanographic Institution, Woods Hole, MA, 02543, Jan. 1992, 41 pages, funding provided by the Office of Naval Technology under Contract No. N00014-90-C-0098.

*Primary Examiner* — Hezron E Williams
*Assistant Examiner* — David Z Huang
(74) *Attorney, Agent, or Firm* — Howard Kaiser

(57) ABSTRACT

According to exemplary inventive practice, a deployment line connects a vessel to an anchor, and a tether connects a buoyant electronic unit to the same anchor. The buoyant electronic unit includes a syntactic foam sphere, and a computer and sensors that are housed in the sphere. The anchor and the buoyant electronic unit are discharged from the vessel and sink in the water. The deployment line mechanically detaches from the anchor when the anchor reaches bottom. The buoyant electronic unit stabilizes into an equilibrium position, tethered vertically and tautly to the anchor. Measurements pertaining to phenomena such as underwater electric potential, pressure, magnetic field, and acceleration are taken by the corresponding sensors and are processed by the computer. An electrical (e.g., acoustical) signal is transmitted to detach the tether from the anchor, whereupon the buoyant electronic unit rises to a retrievable position on the surface of the water.

13 Claims, 15 Drawing Sheets

(51) Int. Cl.
   *B63B 27/10*    (2006.01)
   *G01L 9/00*    (2006.01)
   *G01R 33/02*    (2006.01)
   *G01P 15/00*    (2006.01)
   *G01S 1/72*    (2006.01)
   *B63B 22/00*    (2006.01)

(52) U.S. Cl.
   CPC .............. *G01P 15/00* (2013.01); *G01R 33/02* (2013.01); *G01S 1/72* (2013.01); *B63B 2022/006* (2013.01)

(56) References Cited

U.S. PATENT DOCUMENTS

| | | |
|---|---|---|
| 4,697,958 A | 10/1987 | Kenny, Sr. |
| 5,209,112 A * | 5/1993 | McCoy ................ B63B 22/003 73/170.01 |
| 5,392,258 A | 2/1995 | Gabrielson |
| 5,432,750 A * | 7/1995 | Ream, Jr. ............. G10K 11/008 367/131 |
| 6,370,084 B1 * | 4/2002 | Cray ...................... G01P 15/18 181/122 |
| 7,139,223 B1 | 11/2006 | Scarzello |
| 7,149,150 B1 | 12/2006 | Scarzello |
| 7,179,145 B2 | 2/2007 | Driscoll |
| 7,187,623 B2 | 3/2007 | Greene |
| 7,190,634 B2 | 3/2007 | Lambert |
| 7,289,907 B2 * | 10/2007 | Meinig .................... G01V 1/38 702/2 |
| 7,963,242 B2 | 6/2011 | Wiggin |
| 8,075,226 B2 | 12/2011 | Thompson |
| 8,100,077 B2 | 1/2012 | Collee |
| 8,165,814 B2 | 4/2012 | Kenney |
| 8,220,408 B2 | 7/2012 | Stone |
| 8,279,714 B2 | 10/2012 | Paul |
| 8,378,671 B1 * | 2/2013 | Mahoney ............... G01R 33/02 324/248 |
| 8,534,959 B2 | 9/2013 | Thompson |
| 8,638,956 B2 | 1/2014 | Deng |
| 8,867,315 B2 | 10/2014 | Paul |
| 2008/0192576 A1 | 8/2008 | Vosburgh |
| 2010/0246331 A1 * | 9/2010 | Paul ...................... F16L 11/086 367/173 |
| 2011/0089696 A1 | 4/2011 | Davis |
| 2013/0077435 A1 | 3/2013 | McKey, III |
| 2013/0163374 A1 | 6/2013 | Herrmann |
| 2014/0017010 A1 * | 1/2014 | Jones ................. E21B 43/0122 405/60 |
| 2014/0212986 A1 * | 7/2014 | Angelescu ............... G01N 1/12 436/180 |
| 2014/0315451 A1 | 10/2014 | Hatakeyama |

* cited by examiner

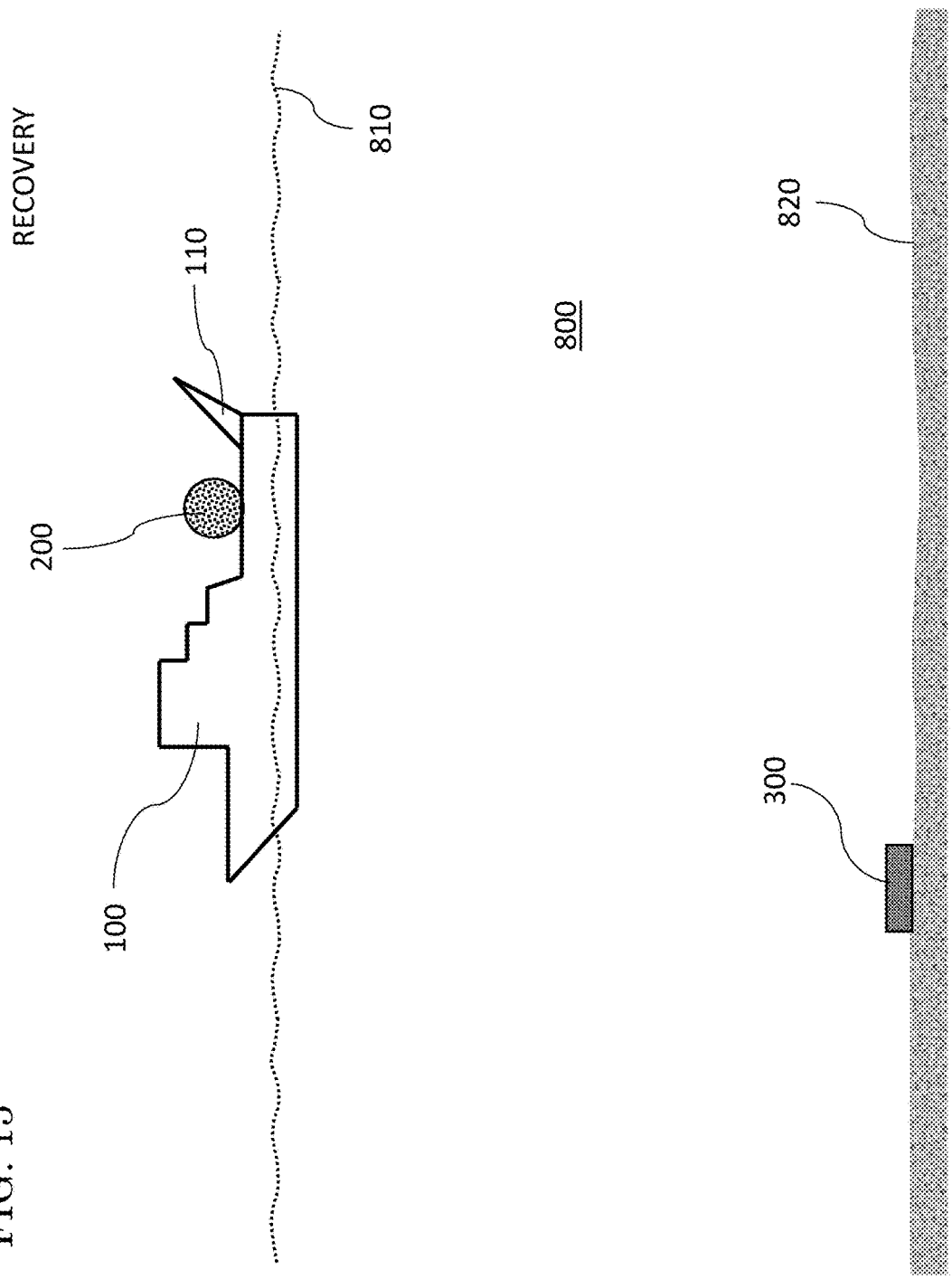

METHOD AND SYSTEM FOR MEASURING PHYSICAL PHENOMENA IN AN OPEN WATER ENVIRONMENT

CROSS-REFERENCE TO RELATED APPLICATIONS

This application claims the benefit of U.S. provisional application Ser. No. 61/976,161, incorporated herein by reference, filing date 7 Apr. 2014, title "In-Water Column Multi-Influence Electro-Magnetic Measurement Device for Open Ocean Environments," listed inventors Robert Andrew Wingo, John J. Holmes, William A. Venezia, Donald E. Pugsley, Eric S. Dykes, Frank Douglas Chapman, Matthew G. Raphaely, and John F. Scarzello.

BACKGROUND OF THE INVENTION

The present invention relates to sensing and measurement of physical phenomena in a marine environment, more particularly to methods and systems for sensing or measuring underwater physical characteristics (e.g., electromagnetic, acoustic, pressure, velocity/acceleration, vibrational, temperature, gravitational, etc.) such as pertaining to signatures of marine vessels.

Measurements of open ocean underwater electromagnetic fields serve many purposes, such as environmental modeling of earth's fields and ocean currents, which can be used for signal-processing noises for cancellation. Existing systems to measure underwater electromagnetic (UEM) signatures require extensive underwater electronics; these electronics can only be serviced by expensive dynamic positioning boats that are difficult to schedule. Systems costs are driven by costs of hardware, deployment/recovery, and life cycle repairs. Even if hardware costs are kept to a minimum, the costs of the deployment scheme may be driven by the costs of the deployment vessels.

SUMMARY OF THE INVENTION

The present invention, as frequently embodied, represents a unique multi-influence electromagnetic field measurement system. The present invention provides an ultra-stable subsurface platform for integrated multisensory underwater electromagnetic and oceanographic physical measurements.

According to exemplary practice of the present invention, an anchor and a vessel are connected using a deployment line. The anchor and a buoyant spherical electronic unit are connected using a tether. The anchor and the buoyant spherical electronic unit are discharged from the vessel into the surrounding water so that the anchor and the buoyant spherical electronic unit sink in the water, sinking while the anchor and the vessel remain connected via the deployment line and while the anchor and the buoyant spherical electronic unit remain connected via the tether. The deployment line is detached from the anchor while the anchor rests at the bottom of the water. The buoyant spherical electronic unit is utilized while the anchor rests at the bottom of the water and while the buoyant spherical electronic unit rests in the water above the anchor. The tether is detached from the anchor so that the buoyant spherical electronic unit rises in the water, rising while the anchor rests at the bottom of the water and subsequent to the utilization of the buoyant spherical electronic unit. The buoyant spherical electronic unit is recovered while the buoyant spherical electronic unit floats at the surface of the water.

An exemplary inventive system includes a complex sensor system housed inside an extremely motion-stable platform, which defines a substantially spherical shape. In-water column measurements are performed using a number of physical influence sensors, including electric and magnetic field sensors. Moreover, an exemplary inventive system carries out a novel deployment and recovery method and uses novel hardware and software. An easily deployable tethered ball of multi-influence sensors is implemented to measure UEM signatures in open ocean environments.

According to exemplary inventive practice, an underwater electromagnetic measurement system includes a spherical buoyant electronic device, an anchor, and a tether connecting the buoyant electronic device and the anchor. The buoyant electronic device is deployed from a marine vessel situated on the water surface, using a mooring-like deployment line (e.g., cable) that connects the vessel to the anchor. The anchor is dropped from the vessel into the water and is slowly lowered (e.g., using a boat crane or ship crane) via the deployment line, until the anchor sinks to the bottom of the water body (e.g., seafloor or ocean floor). When the anchor is positioned at the bottom, the deployment line is disconnected from the anchor.

According to exemplary inventive practice, a complex sensor system is housed inside an extremely motion-stable platform to enable in-water column measurements using a number of physical influence sensors including electric and magnetic field sensors. The present invention features, inter alia, an integration of electrical apparatus including electromagnetic sensor, acoustic sensor, pressure sensor, accelerometer, data acquisition electronics, and power electronics. Situated inside a fiberglass housing, the electrical apparatus encounters a minimal amount of adverse radiated signal interference. The inventive spherical buoyant electronic device is mechanically mounted in an inventively deployed, non-conductive tethered, ultra-stable mooring system.

The buoyant electronic device remains submerged and tethered to the anchor, which is situated on the bottom surface. The buoyant electronic device reaches a submerged equilibrium position in the water, distanced above the anchor in an approximately vertical direction. Stably positioned underwater, the buoyant electronic device is implemented to sense or measure any of various physical phenomena. Subsequent to its implementation, the buoyant electronic device is recovered by the vessel by sending a signal (e.g., acoustic signal) that releases the tether from the anchor. The buoyant electronic device rises to and floats on the surface, where it may be captured by the vessel.

Inventive practice can satisfy all stated parameters of a mission in a cost-effective manner. The present invention's deployment methodology can afford lower deployment costs and greater deployment scheduling flexibility. Generally speaking, the nature of underwater electromagnetic (UEM) measurement is such that deployment should not be restricted to a specific water depth; exemplary practice of the present invention satisfies this requirement.

As frequently embodied the present invention is self-contained; this is advantageous insofar as eliminating costly underwater infrastructure. Furthermore, the present invention can meet challenges of data integration, analysis, and security. Exemplary inventive practice features, inter alia, a stealthy fully integrated sensor suite including an electronics can, a unique configuration of electrode sensors in an ultra-stable glass bead flotation ball, and a deployment rig.

Exemplary inventive practice implements a non-conductive sphere and mounts electric sensors thereon, thereby obtaining a 1.54 gain factor. In addition, exemplary inventive practice provides orthogonal sensor axes rotated 45 degrees. Diametrically opposite sensor pairings are placed on the non-conductive sphere at 45 degree rotations relative to spatial horizontality-verticality, thereby facilitating tethering from the bottom of the non-conductive sphere.

Terms such as spherical buoyant device, "spherical buoy," "flotation sphere," "flotation ball," and "WILMA ball" are used interchangeably herein to refer to the present invention's buoyant electronic measurement device. The present inventors have dubbed exemplary embodiments of their invention "WILMA," as an acronym for "Wingo's In-column Littoral Measurement Apparatus." Robert Andrew Wingo is one of the present inventors.

BRIEF DESCRIPTION OF THE DRAWINGS

The present invention will now be described, by way of example, with reference to the accompanying drawings, wherein:

As shown in FIG. 3, the major components include a vessel component, a buoy component, an anchor component, a tether component, and a deployment line component.

FIGS. 6 through 15 are a chronological sequence of diagrammatic views that together represent an example of deployment (FIGS. 6 through 11) and recovery (FIGS. 12 through 15) in accordance with the present invention.

DESCRIPTION OF EXEMPLARY
EMBODIMENTS OF THE INVENTION

Referring now to the figures, exemplary inventive practice provides for five main components, viz., a vessel component 1000, a buoy component 2000, an anchor component 3000, a tether component 4000, and a deployment line component 5000. Prior to deployment of buoy component 2000 and anchor component 3000 from vessel component 1000, deployment line component 5000 connects anchor component 3000 to vessel component 1000, and tether component 4000 connects buoy component 2000 to vessel component 1000.

Figure 1:
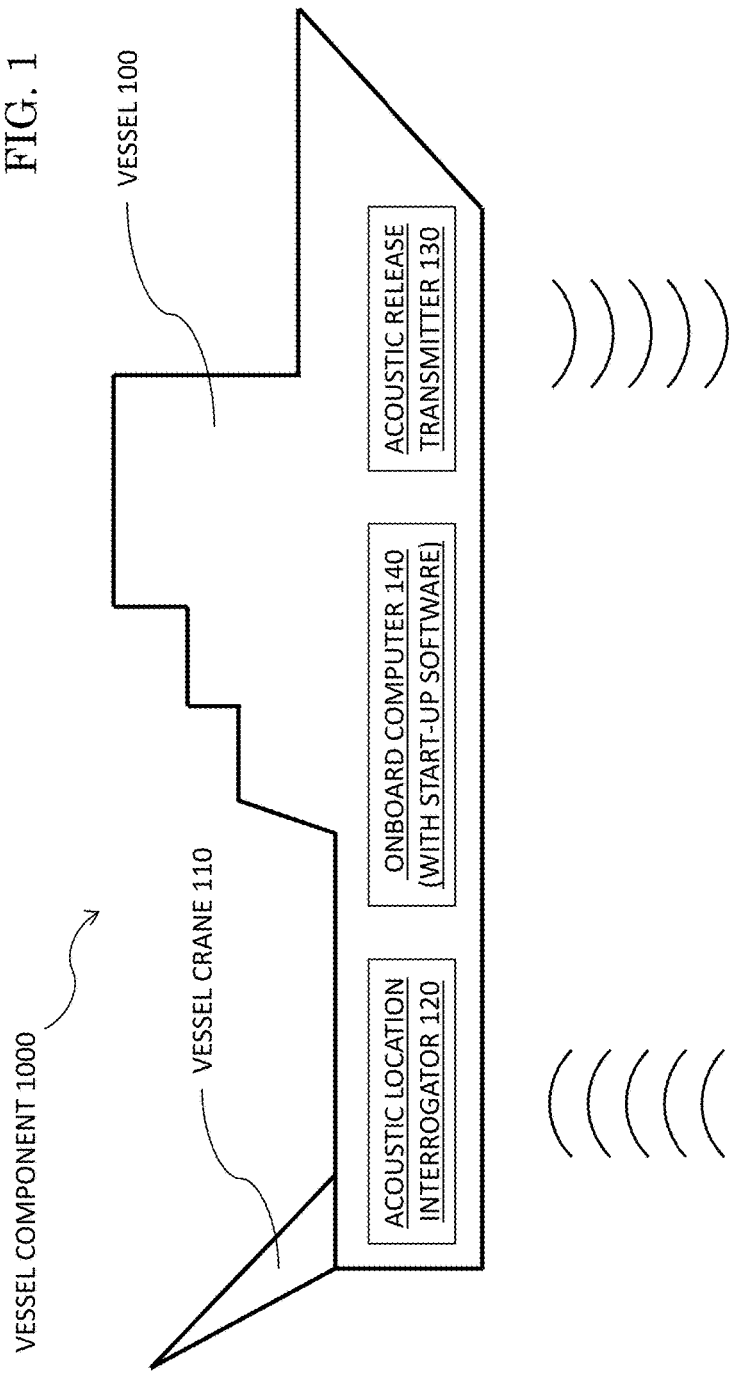
FIG. 1 is a diagrammatic view of an example of a marine vessel component (including a vessel and equipment) in accordance with the present invention.

As illustrated in FIG. 1, vessel component 1000 includes a marine vessel (e.g., boat or ship) 100, a vessel crane 110, an acoustic location interrogator 120, an acoustic release transmitter 130, and an onboard computer 140. An onboard computer 140—for instance, a personal computer (PC)—has a processor and a memory and is situated onboard vessel 100. Vessel 100 navigates a body of water (e.g., sea or ocean) 800 that is characterized by a water surface 810 and bounded below by a water bottom (e.g., sea bottom or ocean bottom) 820. Software including a start-up program is resident in the memory of onboard computer 140.

Particularly as shown in FIGS. 2 through 5, buoy component 2000 includes a spherical buoyant electronic device 200, a DC power supply (e.g., battery pack) 600, and a power cable 610. Battery pack 600 includes a battery pressure housing 601. Battery pack 600 connects to spherical buoy 200 via power cable 610, which extends below spherical buoy 200 and along tether 400. Power cable 610 is adjacent to and coupled with tether 400.

Figure 5:
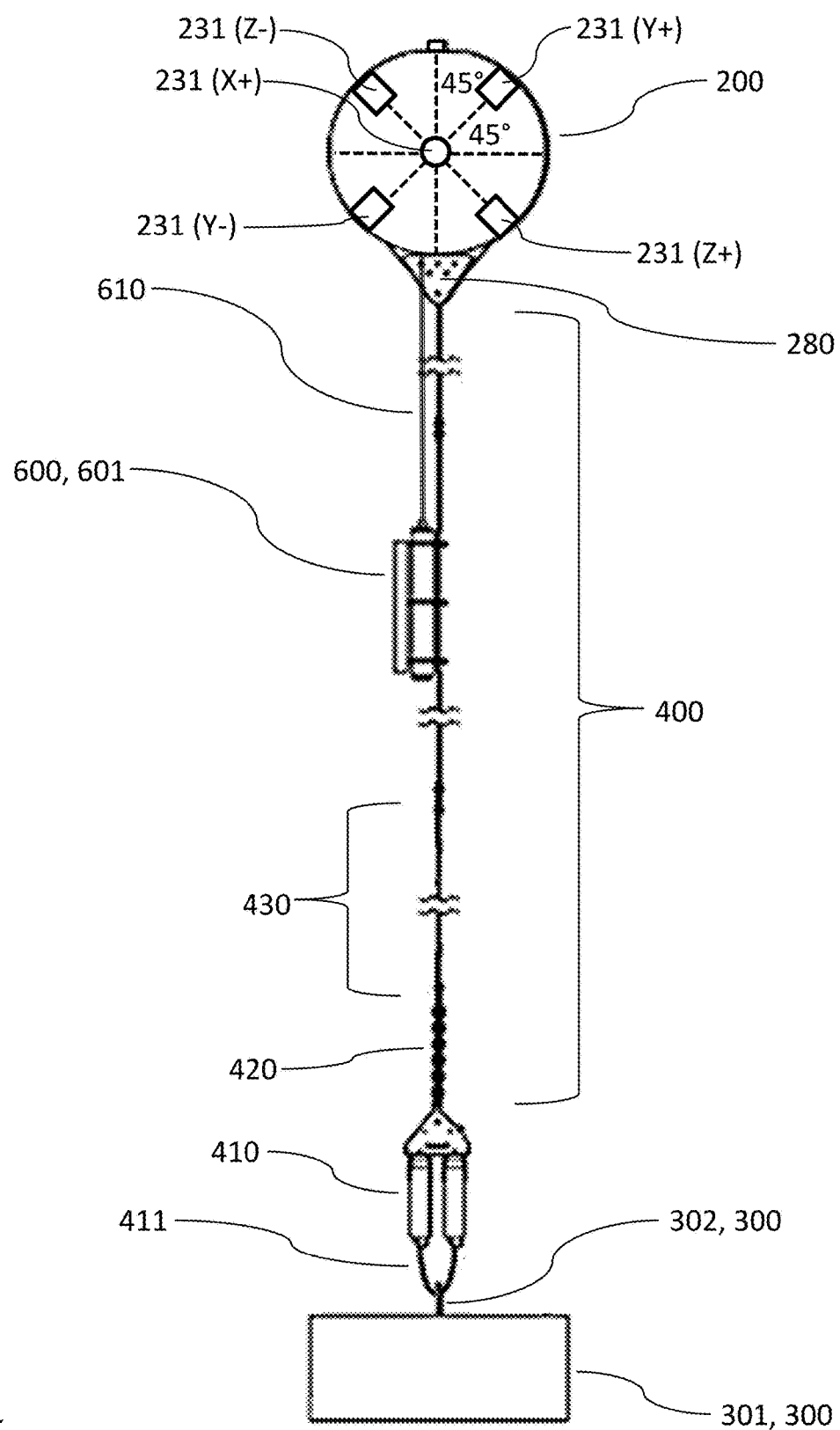
FIG. 5 is a diagrammatic view of the combination including a buoy component, a tether component, and an anchor component in accordance with the present invention.

The electronic "flotation sphere" device 200 includes a syntactic foam spherical housing 210, an access port 220, a three-axis underwater electric potential (UEP) measurement apparatus 230, a pressure-vessel electronics can 240, auxiliary sensors 250, e-field electronics board circuitry 260, a buoy-situate computer 270, and auxiliary structure 280. Access port 220 is a hole or aperture used for mounting electronics can 240 inside syntactic foam sphere 210, and for removing electronics can 240 therefrom. Auxiliary structure 280 may include, for instance, one or more plates and/or rods, for assembling and/or reinforcing electronic flotation sphere device 200, such as involving a joining of two syntactic foam hemispheres. As shown in FIG. 5, an external portion of plate-like auxiliary structure 280 projects downward for facilitating connection of spherical electronic device 200 to tether 400.

Figure 3:
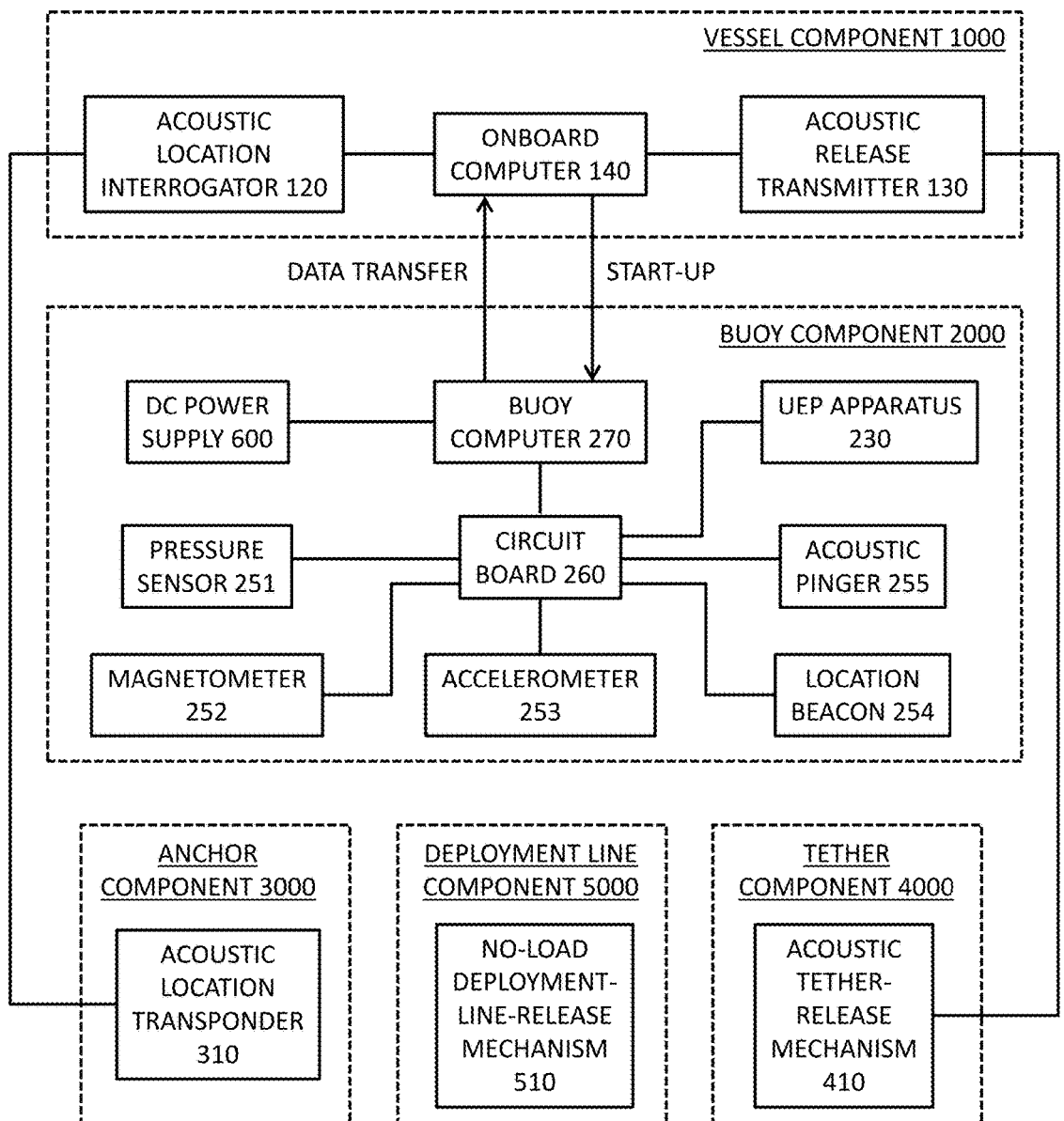
FIG. 3 is a block diagram of an example of the electrical and mechanical functions characterizing a system of major components in accordance with the present invention.
Figure 4:
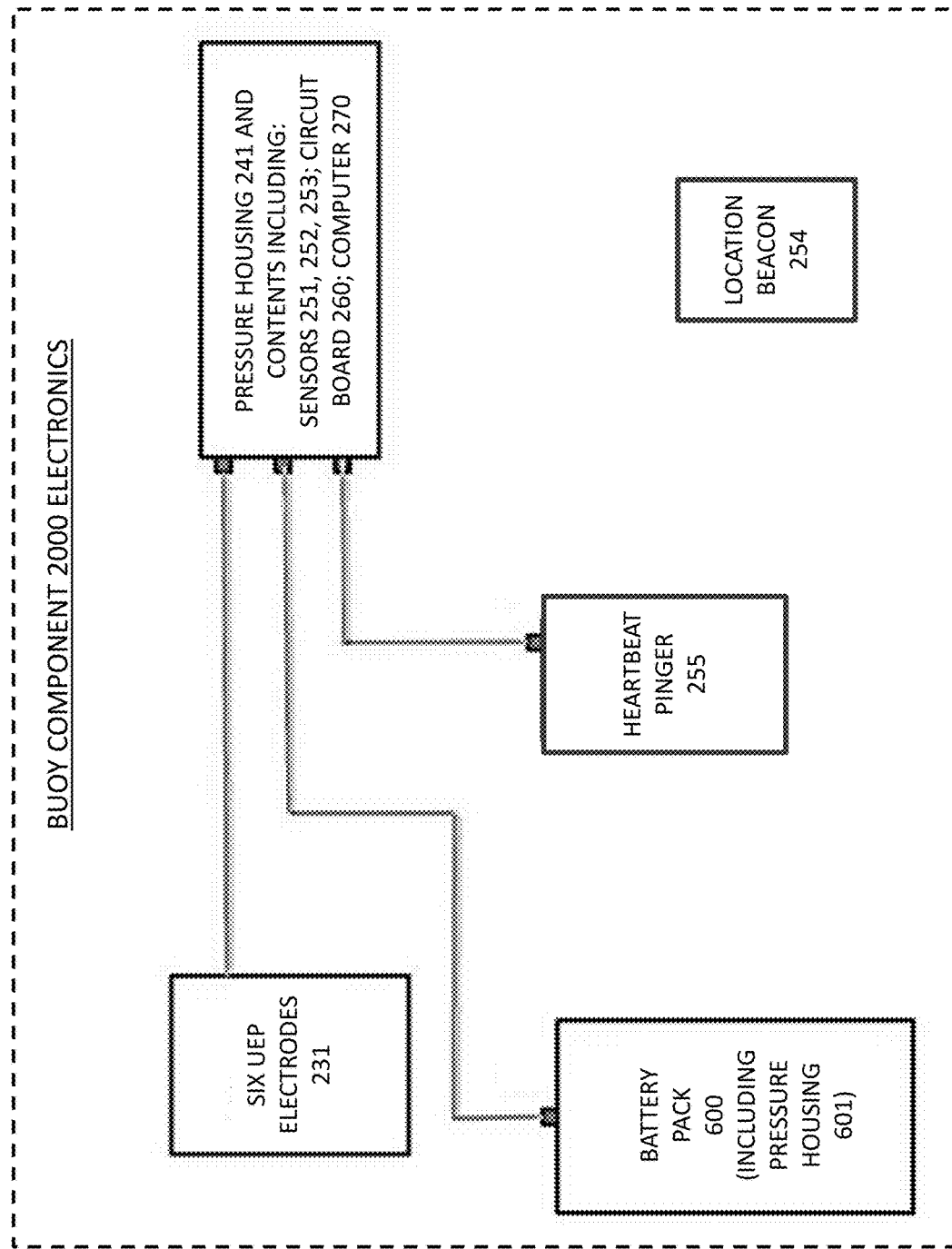
FIG. 4 is a block diagram of an example of the electronics and data acquisition characterizing a buoy component in accordance with the present invention.

In accordance with inventive practice such as exemplified in FIGS. 3 and 4, the inventive data acquisition and storage (DAQ) system includes UEP apparatus 230, auxiliary sensors 250, electronics board circuitry 260, and buoy-situate computer 270. UEP measurement apparatus 230 includes six UEP silver-silver chloride electrodes 231, arranged at the periphery of spherical housing 210. The auxiliary sensors 250 include a pressure (e.g., depth) sensor 251, a magnetometer 252, an accelerometer 253, a location beacon (e.g., IRIDIUM) 254, and an acoustic pinger (e.g., heartbeat pinger) 255. The fiberglass "can" electronics housing 240 houses pressure (depth) sensor 251, magnetometer 252, accelerometer 253, circuit board 260, and buoy-situate computer 270. Buoy-situate computer 270 has a processor and a memory.

Anchor component 3000 includes an anchor 300 and an acoustic location transponder 310, which is in communication with acoustic location interrogator 120 onboard vessel 100. Anchor 300 includes a weight (e.g., cement block) 301 and an anchor ring 302. Deployment line component 5000 includes a deployment line 500 and a non-load deployment-line-release mechanism 510. Tether component 4000 includes a tether (e.g., nonconductive line) 400 and an acoustic tether-release mechanism 410, which has a connection loop (e.g., strap) 411 for engaging anchor ring 302.

Figure 6:
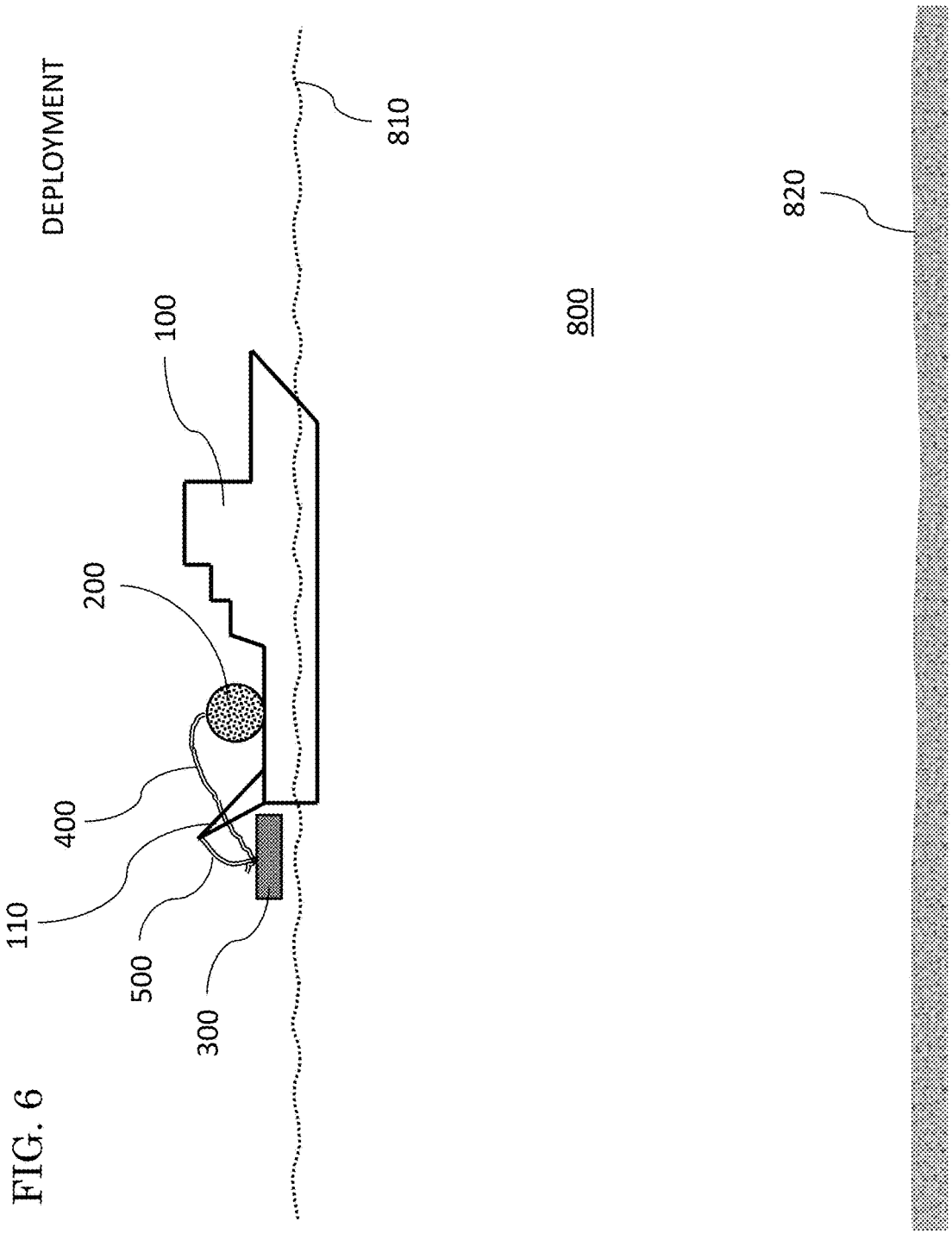

FIGS. 6 through 15 illustrate, by way of example, deployment (FIGS. 6 through 11) and recovery (FIGS. 12 through 15) of a buoyant component 2000. As shown in FIG. 6, during the beginning phase of exemplary inventive deployment, deployment line component 5000 is connected at its upper end (via deployment line 500) to vessel crane 110, and is connected at its lower end (via no-load release mechanism 520) to anchor 300 (via anchor ring 310). Also during the beginning phase, tether component 4000 is connected at its upper end (via tether 400) to spherical buoy 200, and is connected at its lower end (via acoustic release mechanism 410) to anchor 300 (via anchor ring 310).

Computer operation of buoy component 2000 is commenced onboard vessel 100, using start-up software that is resident in the memory of onboard computer 140. For instance, a connectable CAT V ETHERNET cable is used to connect onboard computer 140 to buoy-situate computer 270, thereby initiating the executable software resident in the memory of buoy-situate computer 270. The executable software of buoy-situate computer 270 is divided into two main, separate executable programs, viz.: (i) a lower-level executable program, such as a field-programmable gate array (FPGA) program; and, (ii) a higher-level executable program, such as a controller program.

Figure 7:
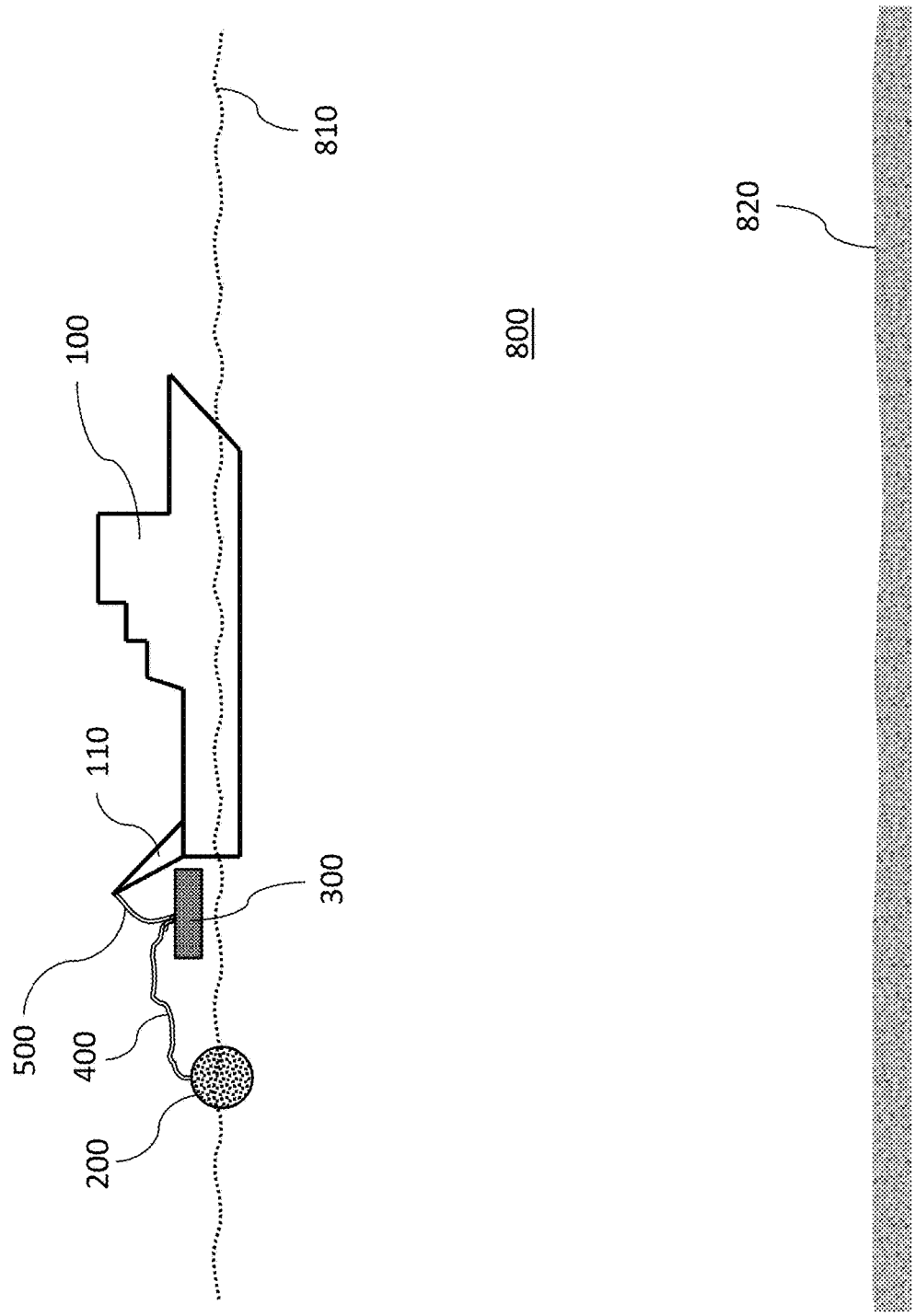
Figure 8:
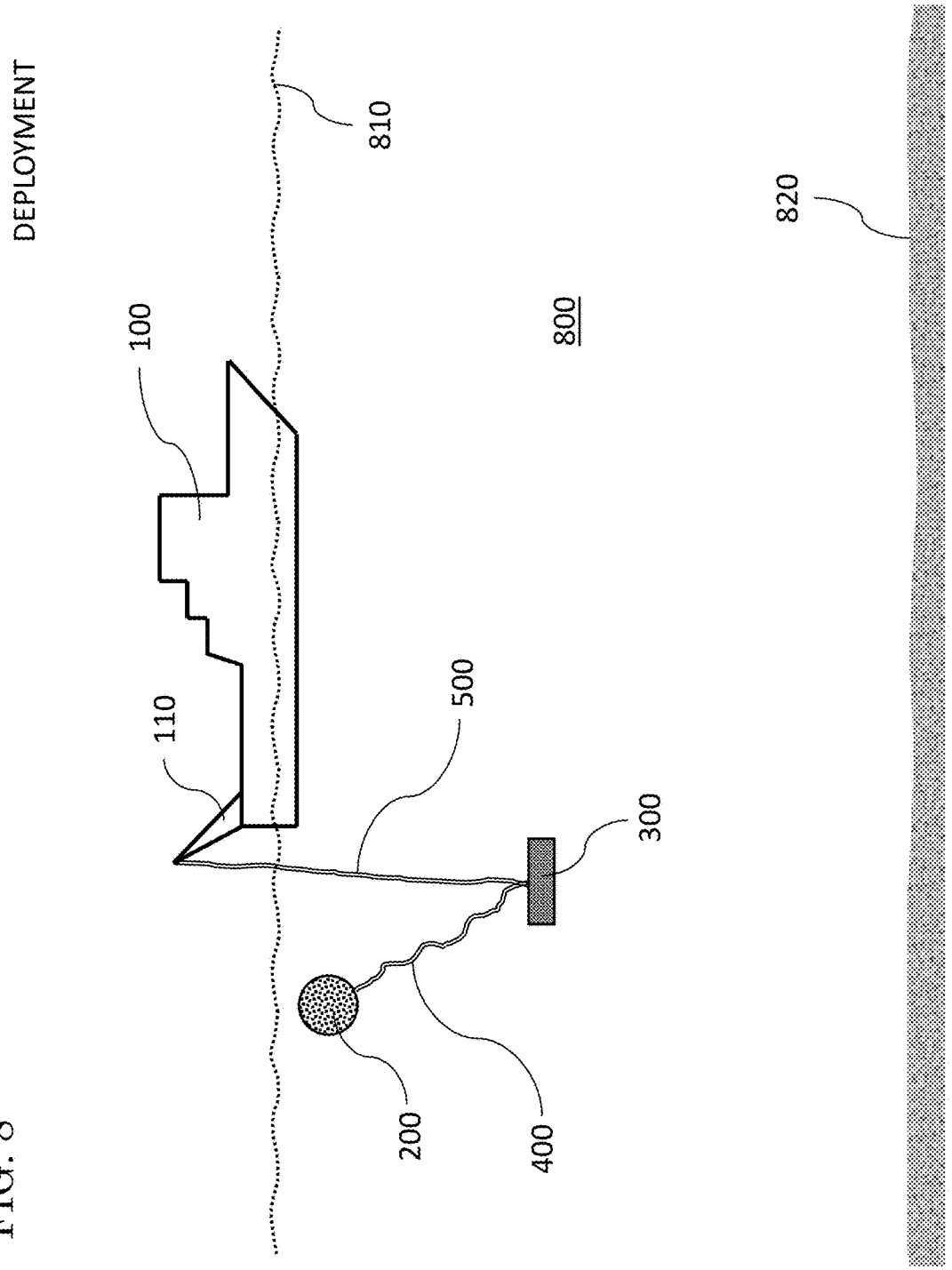
Figure 9:
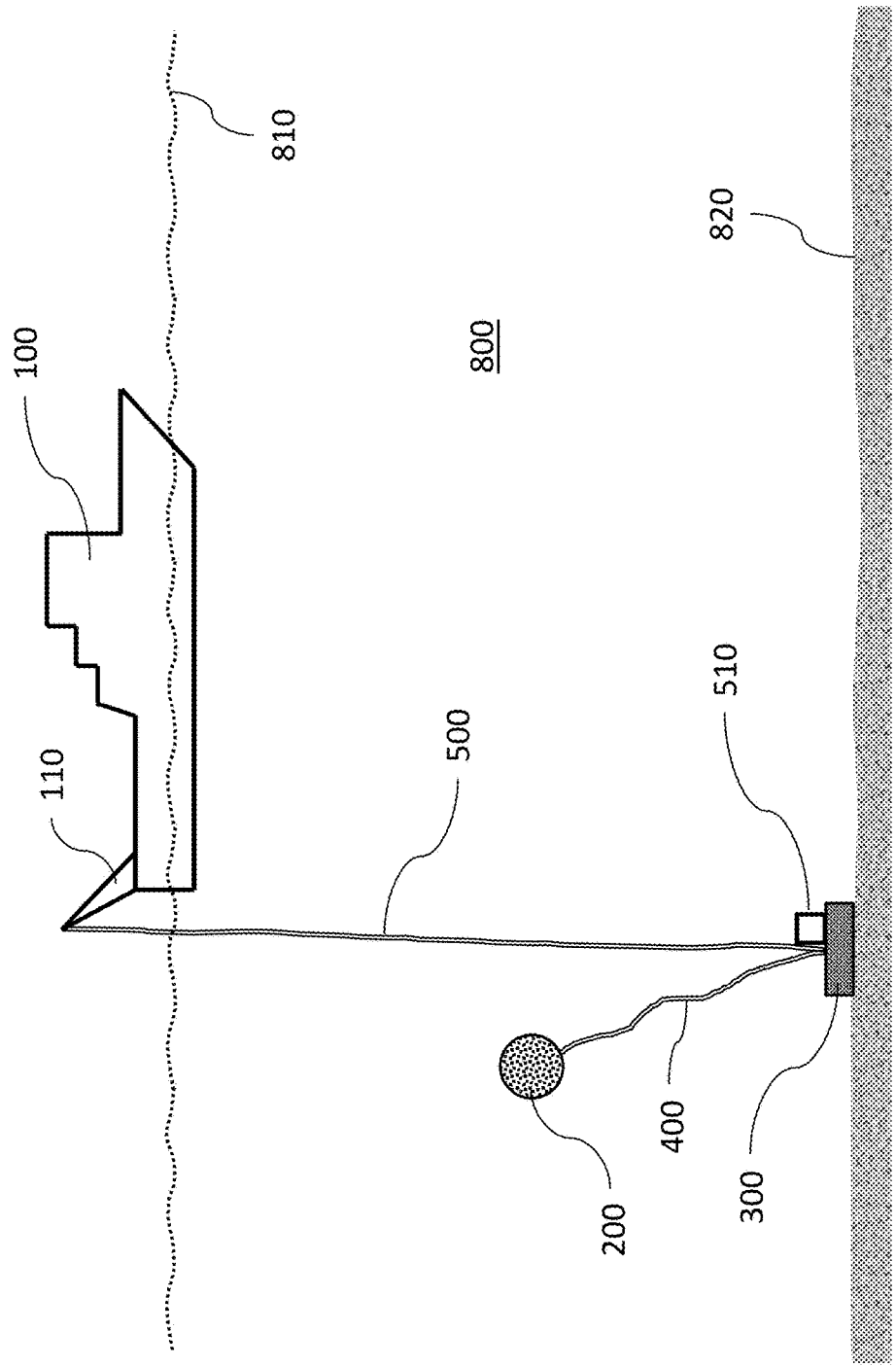

Buoy component 2000 is discharged from vessel component 1000 and floats on water surface 810 (FIG. 7). Then, anchor component 3000 is discharged from vessel component 1000, with buoy component 2000 remaining connected thereto. That is, anchor component 3000 is released from vessel crane 110 while remaining connected thereto via deployment line component 5000. Anchor component 3000 slowly sinks to and settles upon sea/ocean bottom 810, accompanied by buoy component 200 in their respective slow descents through water 800 (FIGS. 8 and 9).

Figure 10:
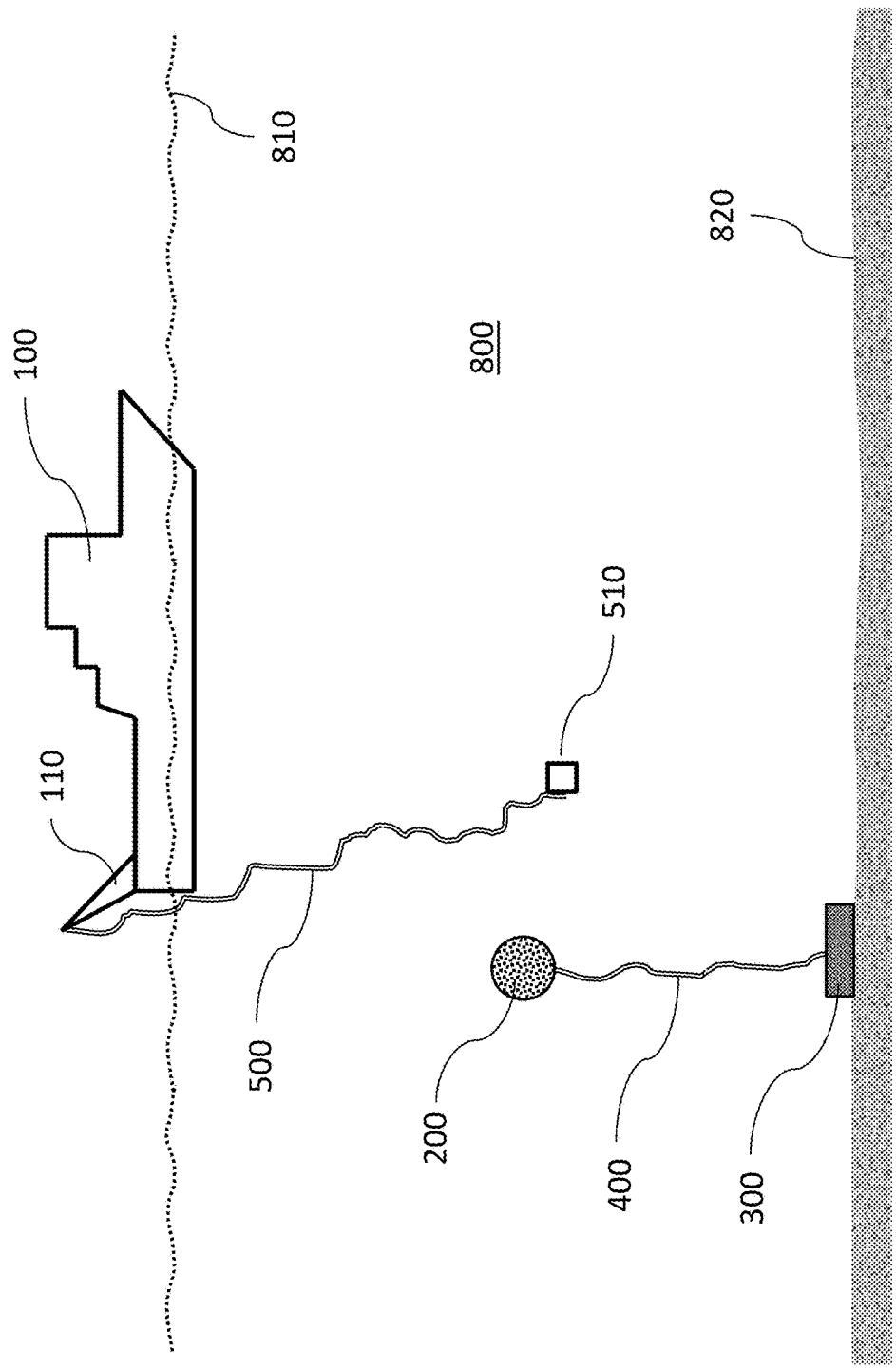

Upon contacting water bottom 810, and hence ceasing its generally downward gravitational (buoyant) motion, no-load displacement-line release mechanism 510 (diagrammatically represented in FIGS. 9 and 10) is activated so as to detach deployment line 500 from anchor 300 (FIG. 10). More specifically, no-load release mechanism 510 automatically disengages from anchor ring 301. An example of a device suitable for inventively implementing mechanical release in such manner is a no-load (zero-gravity) release device such as disclosed by Jones U.S. Patent Application Publication 2014/0017010 A1 issued 16 Jan. 2014, incorporated herein by reference. Displacement-line component 5000 thus detaches and departs from anchor component 3000, and is recovered by vessel component 1000.

Figure 11:
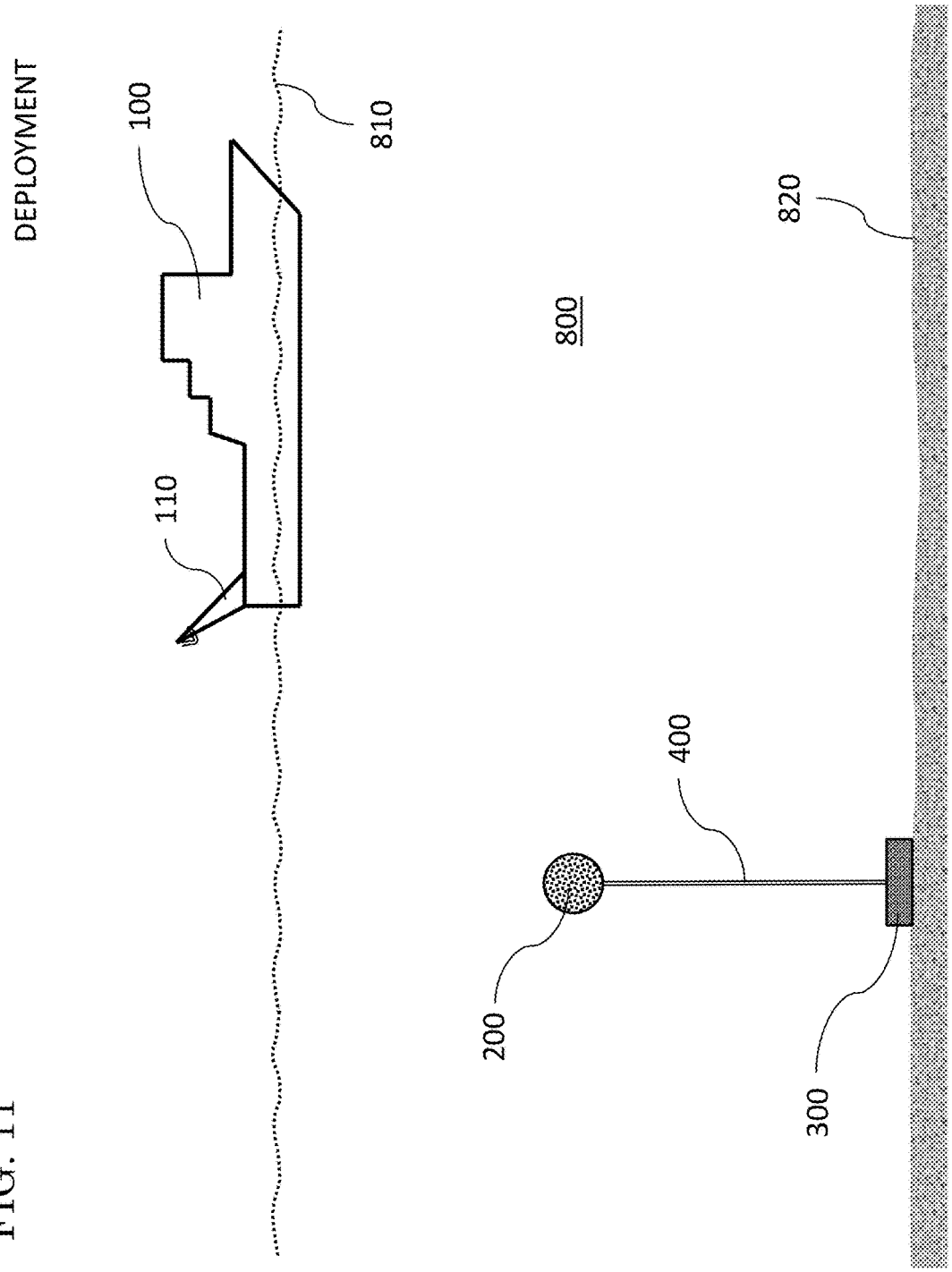

Buoy component 2000, anchor component 3000, and tether component 4000 remain in water 800, with anchor 300 in place at water bottom 820. Buoyant electronic device 200 eventually finds its equilibrium in a stationary position vertically above anchor 300 (FIG. 11). A taut vertical tether 400 connects a buoyantly stationary device 200 and a gravitationally stationary anchor 300. The stage is now set for buoyant electronic device 200's sensors to measure various physical phenomena. At any time during deployment and/or recovery, acoustic location interrogator 120 can communicate with acoustic location transponder 310 to pinpoint the location of anchor component 3000.

Figure 12:
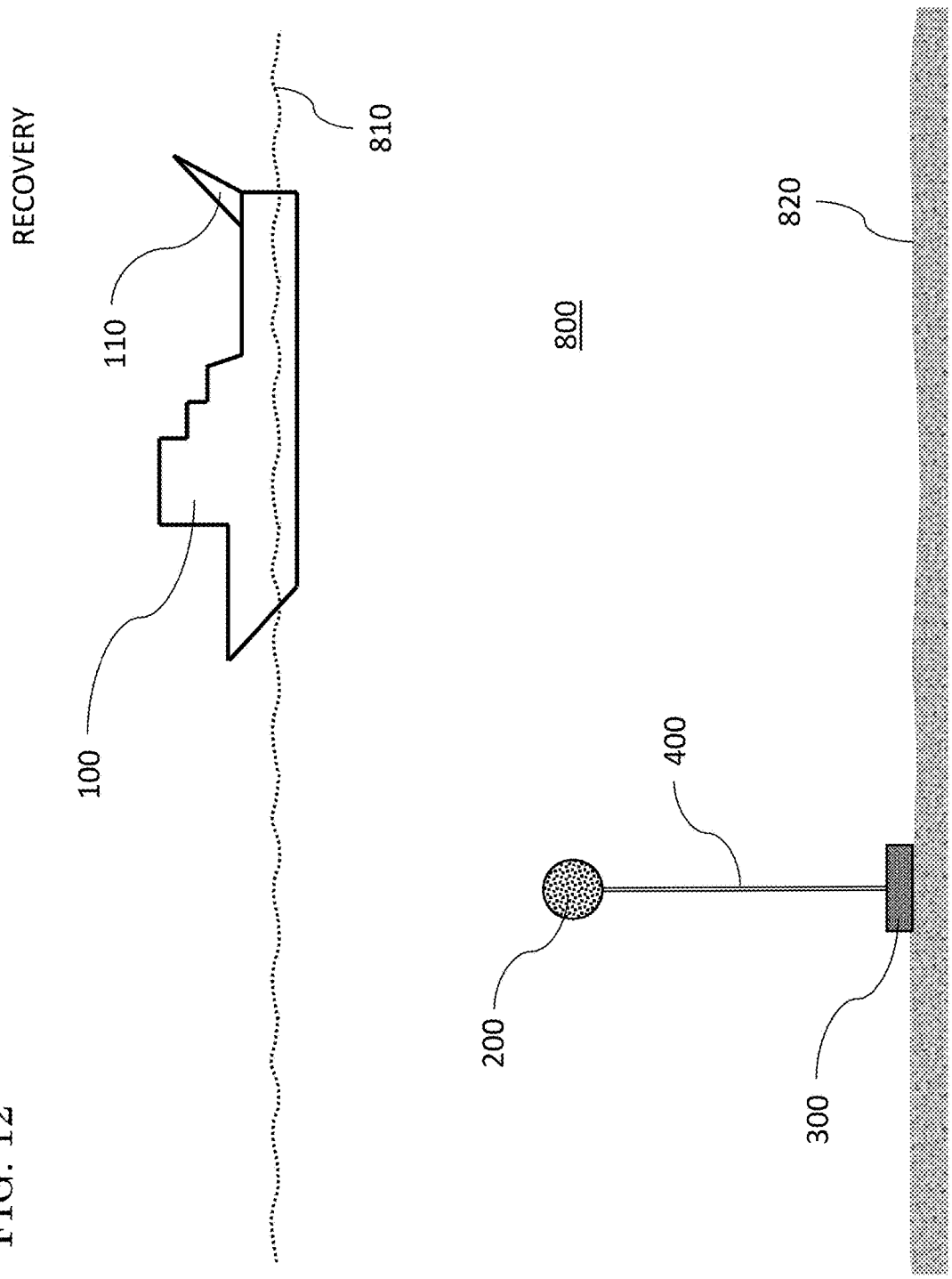
Figure 13:
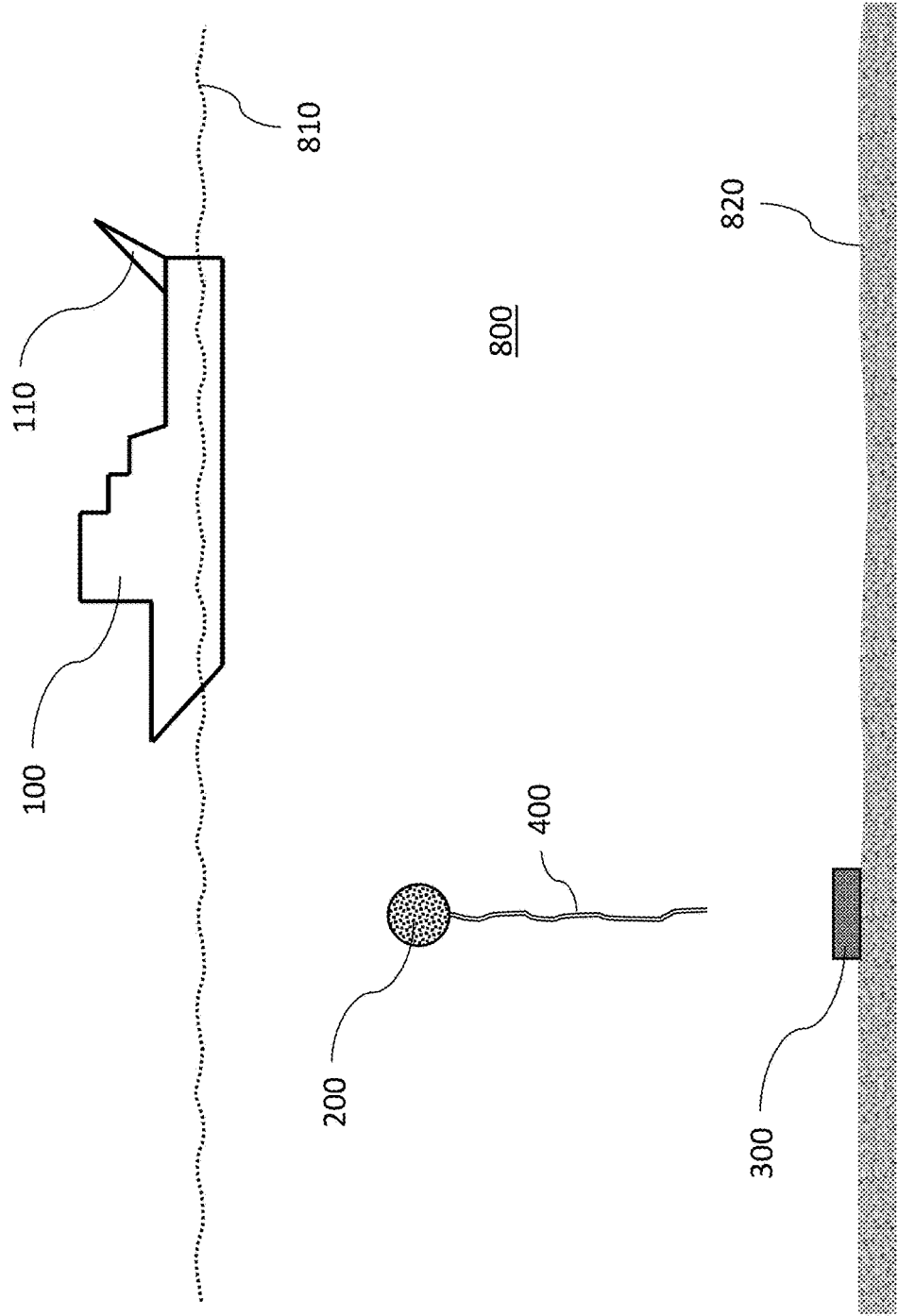

FIG. 5 depicts attachment of tether component 4000 to anchor component 3000 whereby connection loop 421 of acoustic tether-release mechanism 320 engages ring 302 of anchor 300. Having performed all of the measurements and collected all of the data, buoy component 2000 is ready to be recovered by vessel component 1000. Acoustic release transmitter 130 transmits an acoustic release signal to acoustic tether-release mechanism 530 to detach connection loop 411 from anchor ring 302, thereby releasing spherical buoyant electronic device 200 from anchor 300 (FIGS. 12 and 13).

Figure 14:
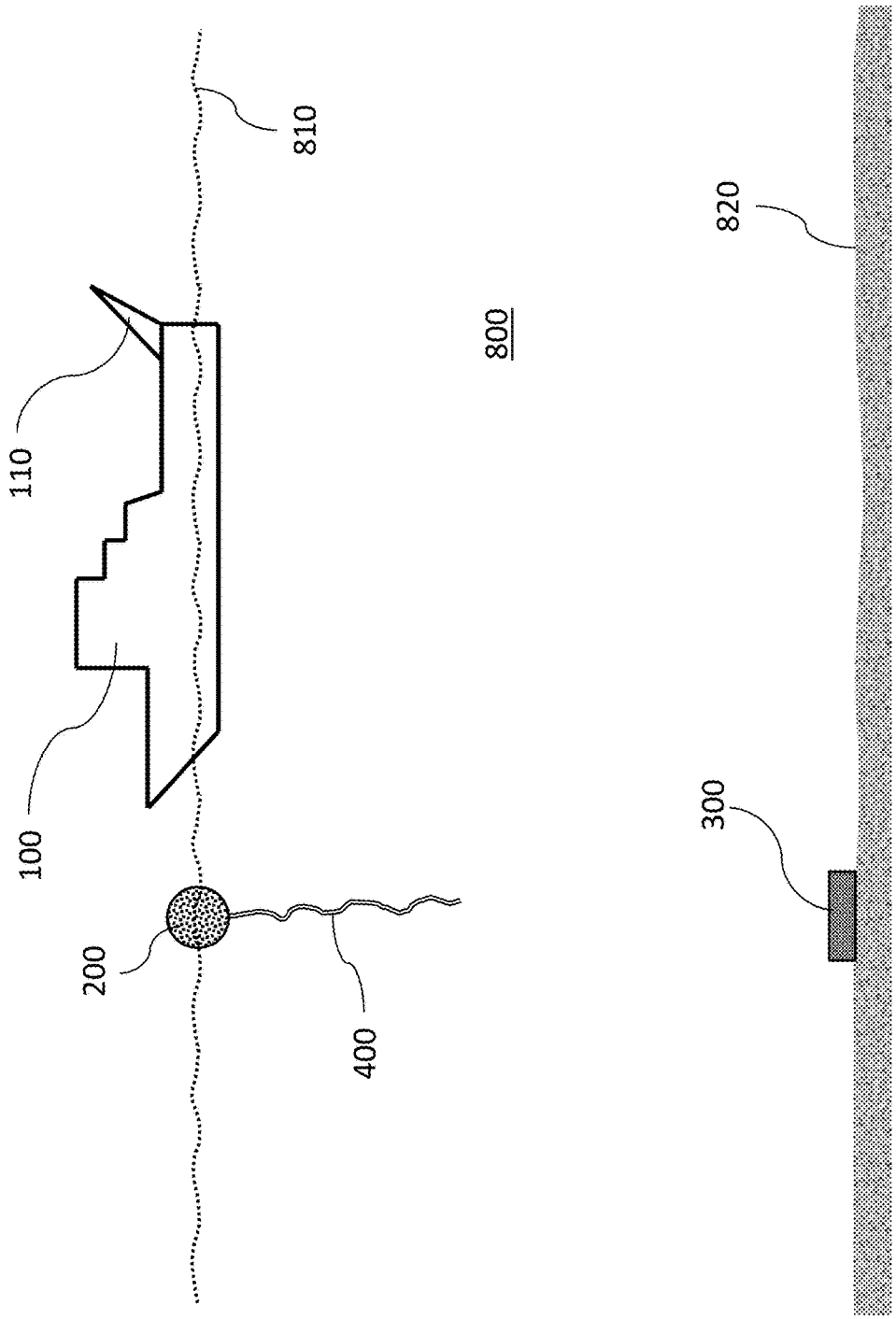

The combination of buoy component 2000 and tether component 4000 buoyantly rises through water 800. After spherical buoy device 200 reaches water surface 810, the combination of buoy component 2000 and tether component 4000 is taken aboard vessel 100 (FIGS. 14 and 15). Buoy-situate computer 270 contains the data collected by spherical buoyant electronic device 200 while stationed underwater in a manner such as depicted in FIG. 11. The collected data may be copied to onboard computer 140.

The figures are illustrative, by way of example, of underwater electromagnetic measurement apparatus, and deployment and recovery thereof, in accordance with the present invention. Implemented to perform measurements is a spherical buoy containing electronics including a sensor package. Measurements are taken while the spherical buoy is tethered and anchored via a nonconductive line extending from an anchor situated on the ocean/sea bottom.

Exemplary practice of the present invention can be considered to combine subsystems including (i) underwater electromagnetic (e.g., UEP) sensors, (ii) auxiliary sensors, (iii) deployment and recovery, and (iv) software and analysis. These inventive subsystems work together to satisfy a given requirement to measure underwater electromagnetic fields in an open ocean environment.

The present invention's spherical-shell flotation device 200 includes a three-axis short baseline underwater electric potential (UEP) measurement apparatus 230, which senses voltage electric potential. The 3-axis UEP measurement apparatus 230 measures the electric field in the water column; this electric field can be influenced by a variety of phenomena, e.g., ions, waves, marine vessels, etc.

UEP measurement apparatus 230 includes six UEP silver-silver chloride electrodes 231, which are embedded in the syntactic foam flotation sphere housing 210. The present invention's spherical arrangement of six UEP electrodes 231 affords a gain of 1.54 over traditional linear UEP short-baseline sensors. The present invention's UEP electrodes 231 are placed orthogonally, but not in the conventional plane of up-left-right (vertical, horizontal left, horizontal right). Rather, the inventive UEP electrodes 231 are placed 45 degrees upright, rotated on the left axis. This unique configuration allows buoy tethering from the bottom of the spherical buoy 200.

Spherical buoyant electronic device 200 is attributed with favorable amplification characteristics. The e-field electronics board 260 serves basically to interface the UEP electrodes 231, in contact with the seawater 800, to a data acquisition system that includes buoy-situate computer 270. Most of the data acquisition system is contained in pressure-vessel electronics "can" 240, located in the spherical buoy housing 210.

Major functions of the e-field electronics board circuitry 260 are to provide very low-noise amplification of the small electric field signals (noise referred to the input is on the order of 4 nV/rt-hz), create a pass-band to allow certain frequency content of information to proceed (0.003 Hz to 3K Hz), and galvanically isolate the electrodes and electronics from the seawater so as to prevent any possible path for ground loops.

The magnetic sensing is placed internal to electronics housing "can" 240, which is situated inside flotation sphere housing 210. Hence, according to exemplary inventive practice, a separate pressure housing is not required if most parts are non-magnetic. However, interference from DC battery sources (such as battery pack 600) and from other small or nearby items will require calibration to eliminate those sources of interference.

Figure 2:
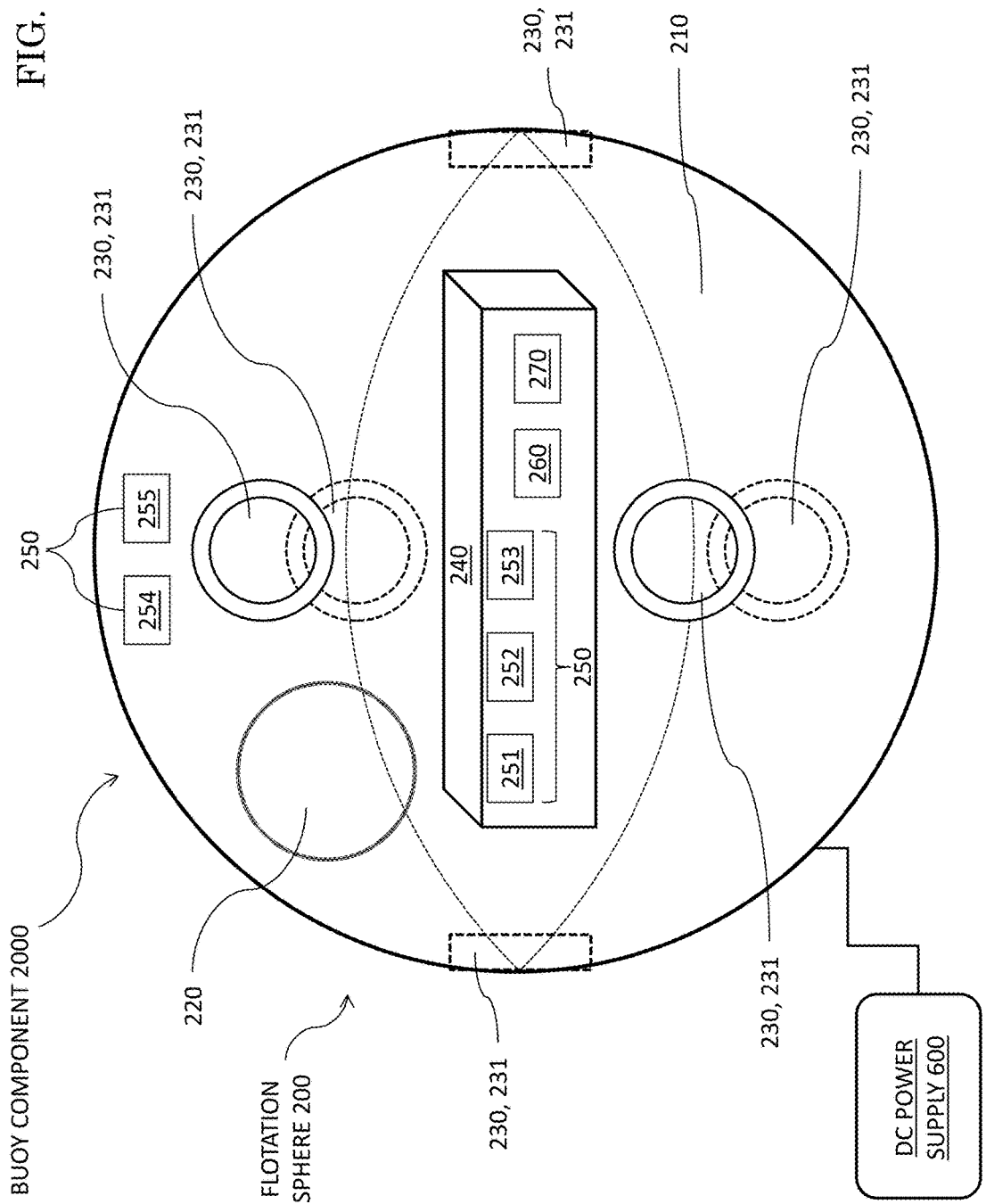
FIG. 2 is a diagrammatic view of an example of a buoy component (including an electronics-embedded spherical buoy and a battery power source) in accordance with the present invention.

With reference to FIGS. 2 and 5, UEP sensor 230, auxiliary sensors 250, circuit board 260, and buoy-situate computer 270 are contained within the syntactic-foam spherical buoy 210; these elements are involved in the data acquisition processes. The Navy produced a prototype of a spherical buoyant electronic device including a syntactic foam spherical housing 210 having a 51-inch diameter. Battery pack 600 is external to and remotely placed in relation to spherical buoyant electronic device 200. Power cable 610 runs from battery pack 600 to spherical electronics buoy 200. In this example, the battery pack is attached to nonconductive tether 400 and is positioned about twelve feet below spherical electronics buoy 200, in order not to influence any magnetic measurements.

Pressure sensor 251, magnetometer 252, and accelerometer 253 are contained in electronics "can" pressure housing 240. Other auxiliary sensors include location beacon 254 and acoustic pinger 255. Auxiliary sensors 250 can include commercial off-the-shelf units and can be combined with other electronics in a manner such as illustrated in FIGS. 3 and 4. Battery power (e.g., alkaline battery pack) 600 provides stand-alone operation.

FIGS. 6 through 15 illustrate an example of a deployment-and-recovery methodology in accordance with the present invention. Vessel 100 can be selected among diverse types and sizes, for example a standard propulsion medium-size deck boat with A-frame. As shown in FIGS. 11 and 12, buoy component 2000 (which includes spherical electronic buoyant device 200, battery pack 600, and power cable 610) is tautly moored to the seafloor by means of an anchoring system provided by anchor component 3000 (in particular, anchor 300) and tether component 4000. An inventive system's taut mooring can be deployed at practically any sea bottom depth practically anywhere during electromagnetic collection events.

FIG. 5 illustrates an inventive mooring including buoy component 2000, anchor component 3000, and tether component 4000. Tether component 4000 includes tether 400 and acoustic tether-release mechanism 410. According to exemplary inventive practice, most of the length of tether 400 is constituted by one or more rope or cable segments, with the remaining length of tether 400 constituted (e.g., at the bottom end of tether 400) by one or more chain segments such as depicted by chain 420.

Most of tether 400 is of fixed length, with one or more tether segments being adjustable in length such as depicted by adjustable-length segment 430. By virtue of such adjustability of tether 400 length, the height of the inventive mooring above seafloor 820 can range between a minimum height and a maximum height equal to the maximum total length, top-to-bottom, of the inventive mooring. As an example, an inventive mooring can be designed to have a small watch circle (e.g., ±15 feet) and a small amount of depth change (e.g., ~4 feet) in its extremes;

Anchor component 3000 includes anchor 300 and acoustic location transponder 310. Referring to FIGS. 6 and 7, at the beginning of inventive deployment electronic flotation ball 200 is discharged from the deck of vessel 100, and a small amount of line is trailed out. As illustrated in FIGS. 8 and 9, anchor 300 is hoisted from deck crane 110, tethering line 400 is played out behind vessel 100, and anchor component 3000 is slowly lowered down to the sea bottom 820 toward a desired location on sea bottom 820.

On contact with sea bottom 820, no-load deployment-line release mechanism 410 detaches anchor 300, as shown in FIG. 10. The established location of anchor 300 on sea bottom 820 is recorded for use in analysis. Electronic flotation ball 200 buoyantly rises until it can rise no more, and the inventive mooring is thus configured for conducting measurements, as shown in FIGS. 11 and 12. The inventive mooring has thereby attained an equilibrium whereby electronic flotation ball 200 is stationed atop taut tether 400, which is connected below to anchor 300.

During recovery, an acoustic release signal is transmitted by acoustic release transmitter 130 to acoustic tether-release mechanism 410, whereupon electronic flotation ball 200 rises to the surface 810 for recovery by vessel crane 110, as shown in FIGS. 13 and 14. The combination of buoy component 2000 and tether component 4000 is taken aboard vessel 1000, and data is collected from buoy-situate computer 270.

In exemplary inventive practice, a primary objective of the inventive software is to acquire and store electromagnetic field data. An exemplary computer program of the present invention provides data correlation to outside events. In addition, since the inventive system is completely stand-alone, some feedback to the user is needed to ensure that the unit is operating properly while at the same time maintaining a level of security as to the nature of the data.

Exemplary inventive software has two distinct software components, viz., executable software and start-up software. By way of example, the executable software is run on a National Instruments Controller (NI 9076), a buoy-situate computer 270 located inside spherical buoy electronic device 200. The start-up software is run on a personal computer (PC) 140 situated onboard vessel 100. Onboard PC 140 and NI 9076 buoy-situate computer 270 are connectable to each other by a CAT V ETHERNET cable.

According to an example of inventive practice, the inventive executable software is divided into two distinct executable programs that should work together in order for the inventive sensing system to operate correctly. The lower-level executable program is the field-programmable gate array (FPGA) program, which controls National Instruments modules. The higher-level executable program is the controller program, which converts, down-samples, and recodes the data, and which activates heartbeat pinger 255. The FPGA program and the controller program reside in NI9076 controller 270 in spherical electronic buoy 200. Inventive software powers up when the inventive system is plugged into power. If the power is disconnected and regains power, the inventive system will restart without the appropriate start-up variables.

Exemplary inventive embodiments include an acoustic pinger 255 in order that the inventive system can indicate proper operation, or operation with errors, or loss of power. Pinger 255 has an internal setting for period, frequency, and power output. If the inventive system is operating correctly, the internal relay is closed every hour for two minutes to activate pinger 255. If the inventive system is having an error or errors, pinger 255 remains on continuously. If the inventive system is not powered, then pinger 255 will not operate.

Exemplary performance of inventive analysis includes time correlation of the acquired data with a GPS clock signal, and application of the engineering unit conversions placed in the unit on deployment. Unique calibration data is applied for ball rotation analysis (i.e., rotation of the buoyant sphere 200), utilizing auxiliary sensors 250 in the buoyant sphere unit.

An inventive system has recently been developed and deployed by the Navy. This inventive system was developed for electromagnetic sensor systems, describes a moored configuration for conducting measurements, and is currently being used to measure UEM environmental effects in open ocean waters. The currently deployed inventive system demonstrates the integration of state-of-the-art components (electronics and sensors) as well as the incorporation of a self-contained data acquisition and storage system. The data acquisition and storage system has programmable temporal control, or is capable of receiving external command signals and transmitting its status, commands, and related information.

Exemplary inventive practice features, inter alia, the following: a total integration of sensitive electromagnetic, acoustic, pressure, accelerometers sensors, data acquisition and power electronics; a minimum of adverse radiated signal interference inside the fiberglass "can" housing; and, mechanical mounting and easy deployability of a non-conductive tethered ultra-stable buoy system. The inventive system can propitiously implement sensors, data acquisition electronics, and data storage technologies (e.g., thumb drives and USB solid state drives) that are state-of-the-art.

Exemplary embodiments of the present invention utilize a sensor suite in a moored configuration. An alternative mode of inventive practice provides for use of a sensor suite for easily deployed bottom-ranging systems, in forward areas, without cables connected to shore. Acoustic data and control telemetry modems, along with a calibrated EM source, could ensure the accuracy of measurements.

An inventive apparatus can be embodied as a drill sea mine simulator unit. An exemplary inventive system configuration can be designed to simulate a moored sea mine. The inventive sea mine simulator can be used as a moored mine practice device. It can be used for training with respect to, for instance, detection and signature measurement functions for susceptibility or vulnerability to the moored sea mine. When equipped with an acoustic modem and data telemetry link, data and mine response can be conveyed to the mine countermeasures (MCM) hunter/sweeper or ship under test. Another possible area of application of inventive practice is conduction of in-water physical ocean measurements in order to support complex climate change models.

The present invention's underwater-deployable UEP sensing system is unique as compared with conventional sensing systems geared toward accomplishing similar purposes. An exemplary inventive UEP sensing system uses three pairs of orthogonal UEP sensing elements, to allow computation of a total underwater electric field. Conventional UEP sensing systems have only two pairs of UEP sensing elements, and these are horizontally oriented. Furthermore, exemplary inventive practice utilizes a flotation device as a mount for the electric sensing elements. Conventional systems utilize a separate float, or extended sensing elements mounted on booms.

In addition, exemplary inventive practice avails itself of the insulating properties of syntactic foam to provide sensing gain equivalent to 1.54 times the diameter of the flotation device, reducing overall handling size of the apparatus. Moreover, as distinguished from conventional practice, inventive practice rotates the sensing elements to allow tethering of a buoy from bottom. The present invention represents a unique methodology whereby three-axis UEP sensing is incorporated into a tethered system.

Conventional practice for measuring electric fields in water (e.g., ocean water or seawater) includes placing two sensing electrodes in the water so as to be separated by a fixed distance. In conventional practice, the two sensing electrodes are mounted on the ends of a linear structure such as a thin non-conducting rod or bar. According to this linearly configured sensing methodology, the electric current in the water flows from one electrode in the pair directly to the second. For this conventional approach, let us designate a voltage difference $\Delta V_1$ between two linearly mounted electrodes that are separated a linear distance L.

According to exemplary inventive practice for measuring electric fields in water (e.g., ocean water or seawater), pairs of electrodes are mounted on diametrically opposite sides of a non-conducting sphere. Let us assume that the diameter of the present invention's non-conducting sphere is L. The distance between two spherically mounted electrodes in this inventive example equals the distance between the two linearly mounted electrodes in the conventional example above. Let us designate a voltage difference $\Delta V_2$ between two spherically mounted electrodes that are diametrically opposite and hence separated linear distance L. Based on a theoretical computation, the present invention's voltage difference $\Delta V_2$ is fifty-four percent (54%) larger than the conventional voltage difference $\Delta V_1$, for the same applied electric field in the water. That is, $\Delta V_2 = 1.54\ \Delta V_1$. Even though the separation L between the electrodes is the same in both cases, the voltage measured by the spherically mounted electrodes is 54% larger than the voltage measured by the linearly mounted electrodes.

To further explain, current that travels halfway around a spherical circumference of diameter L travels a greater distance than does current that travels along a linear structure (e.g., bar) of length L (which equals diameter L). Current traveling a circumferential path corresponding to a diameter L produces a voltage difference between electrodes that is commensurate greater than the voltage difference between electrodes that is produced by current traveling a linear path of length L=diameter L. Theoretical analysis of a uniform electric current imparted on the present invention's non-conducting sphere demonstrates that the electric field measured by the present invention's two diametrically opposite electrodes is equal to the electric field measured by two linearly opposite electrodes that are separated approximately 1.54 times the diameter of the present invention's non-conducting sphere. By using a non-conductive sphere on which to mount the electric sensors, exemplary inventive practice obtains a 1.54 gain factor.

Exemplary inventive practice effects precise bottom location of a mooring weight, during deployment from a standard boat A-frame, by utilizing acoustic transponder(s) on the weight and a "no-load" release mechanism. According to conventional practice, use of an expensive dynamic positioning navigation system on the deployment vessel is required to precisely locate an object or system. Furthermore, exemplary inventive practice implements a water flow-shedding mooring line to reduce strumming vibrations of the mooring float sensors, as an exemplary inventive system has highly sensitive magnetic sensors.

Uniquely featured by exemplary practice of the present invention is a sensory combination including: (i) UEP sensing by three-axis-paired electrodes; (ii) three-axis magnetic field sensing; (iii) three-axis accelerometer sensing; and, (iv) water pressure (water depth) sensing. The magnetic field sensing, accelerometer sensing, and pressure sensing facilitate precise depth location and orientation of the present invention's flotation device. The present invention's combination of sensing parameters is unique; conventional systems do not employ same or similar combination.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A marine sensing system comprising:
   a buoyant electronic unit including a syntactic foam spherical housing and further including, housed in said syntactic foam spherical housing, an underwater electric potential sensor, a pressure sensor, a magnetometer, and an accelerometer;
   an anchor;

a deployment line connecting said anchor and a vessel;

a tether connecting said anchor and said buoyant electronic unit;

a zero-load-activated release mechanism, associated with said deployment line, for disconnecting said deployment line from said anchor when said anchor sinks to and reaches a bottom surface of a body of water;

an acoustic-signal-activated release mechanism, associated with said tether, for disconnecting said tether from said anchor situated on said bottom surface of said body of water;

wherein said buoyant electronic unit further includes a pressure-vessel container, housed in said syntactic foam spherical housing and containing said pressure sensor, said magnetometer, and said accelerometer.

2. The marine sensing system of claim 1 wherein in said body of water, subsequent to said disconnection of said deployment line from said anchor, said buoyant electronic unit attains a stationary position while said tether connects said buoyant electronic unit and said anchor situated on said bottom surface of said body of water.

3. The marine sensing system of claim 1 further comprising said vessel, for navigating said body of water.

4. The marine sensing system of claim 3 further comprising a crane associated with said vessel, said crane for facilitating said connection, via said deployment line, of said anchor and said vessel.

5. The marine sensing system of claim 3 further comprising an acoustic release transmitter, onboard said vessel, for sending an acoustic signal to said acoustic-signal-activated release mechanism.

6. The marine sensing system of claim 1 wherein said buoyant electronic unit further includes a computer, housed in said syntactic foam spherical housing and capable of processing data received from said underwater electric potential sensor, said pressure sensor, said magnetometer, and said accelerometer.

7. A marine sensing system of claim 5 comprising:
a buoyant electronic unit including a syntactic foam spherical housing and further including, housed in said syntactic foam spherical housing, an underwater electric potential sensor, a pressure sensor, a magnetometer, and an accelerometer;

an anchor;

a deployment line connecting said anchor and a vessel;

a tether connecting said anchor and said buoyant electronic unit;

a zero-load-activated release mechanism, associated with said deployment line, for disconnecting said deployment line from said anchor when said anchor sinks to and reaches a bottom surface of a body of water;

an acoustic-signal-activated release mechanism, associated with said tether, for disconnecting said tether from said anchor situated on said bottom surface of said body of water;

wherein said buoyant electronic unit further includes, housed in said syntactic foam spherical housing, a pressure-vessel container and a computer, wherein:

said pressure-vessel-container contains said pressure sensor, said magnetometer, said accelerometer, and said computer;

said computer is capable of processing data received from said underwater electric potential sensor, said pressure sensor, said magnetometer, and said accelerometer.

8. The marine sensing system of claim 7 wherein said buoyant electronic unit further includes a pinger housed in said syntactic foam spherical housing, and wherein said computer is capable of processing data received from said pinger.

9. A marine sensing system of claim 5 comprising:
a buoyant electronic unit including a syntactic foam spherical housing and further including, housed in said syntactic foam spherical housing, an underwater electric potential sensor, a pressure sensor, a magnetometer, and an accelerometer;

an anchor;

a deployment line connecting said anchor and a vessel;

a tether connecting said anchor and said buoyant electronic unit;

a zero-load-activated release mechanism, associated with said deployment line, for disconnecting said deployment line from said anchor when said anchor sinks to and reaches a bottom surface of a body of water;

an acoustic-signal-activated release mechanism, associated with said tether, for disconnecting said tether from said anchor situated on said bottom surface of said body of water;

wherein:
said syntactic foam spherical housing is characterized by a diameter;

said underwater electric potential sensor includes three diametrically opposite pairs of sensor electrodes situated at the periphery of said syntactic foam spherical housing;

said three diametrically opposite pairs of sensor electrodes are correspondingly arranged in three orthogonal X-Y-Z sensor axes;

said three orthogonal X-Y-Z sensor axes are disposed at forty-five degree rotations with respect to three orthogonal X-Y-Z axes characterizing three-dimensional space.

10. The marine sensing system of claim 9 wherein:
said tether is attached to said syntactic foam spherical housing at a bottom location of said syntactic foam spherical housing;

said forty-five degree rotational dispositions of said three orthogonal X-Y-Z sensor axes facilitate said attachment of said tether at said bottom location of said syntactic foam spherical housing.

11. A marine sensing system of claim 5 comprising:
a buoyant electronic unit including a syntactic foam spherical housing and further including, housed in said syntactic foam spherical housing, an underwater electric potential sensor, a pressure sensor, a magnetometer, and an accelerometer;

an anchor;

a deployment line connecting said anchor and a vessel;

a tether connecting said anchor and said buoyant electronic unit;

a zero-load-activated release mechanism, associated with said deployment line, for disconnecting said deployment line from said anchor when said anchor sinks to and reaches a bottom surface of a body of water;

an acoustic-signal-activated release mechanism, associated with said tether, for disconnecting said tether from said anchor situated on said bottom surface of said body of water;

wherein:
said syntactic foam spherical housing is characterized by a diameter;

said underwater electric potential sensor includes three diametrically opposite pairs of sensor electrodes situated at the periphery of said syntactic foam spherical housing;

each said diametrically opposite pair of sensor electrodes attains a 1.54 gain factor.

12. The marine sensing system of claim 11 wherein:

said three diametrically opposite pairs of sensor electrodes are correspondingly arranged in three orthogonal X-Y-Z sensor axes;

said three orthogonal X-Y-Z sensor axes are disposed at forty-five degree rotations with respect to three orthogonal X-Y-Z axes characterizing three-dimensional space.

13. The marine sensing system of claim 12 wherein:

said tether is attached to said syntactic foam spherical housing at a bottom location of said syntactic foam spherical housing;

said forty-five degree rotational dispositions of said three orthogonal X-Y-Z sensor axes facilitate said attachment of said tether at said bottom location of said syntactic foam spherical housing.

\* \* \* \* \*

UNITED STATES PATENT AND TRADEMARK OFFICE
CERTIFICATE OF CORRECTION

PATENT NO.        : 9,651,374 B1
APPLICATION NO.   : 14/677428
DATED             : May 16, 2017
INVENTOR(S)       : Robert Andrew Wingo et al.

It is certified that error appears in the above-identified patent and that said Letters Patent is hereby corrected as shown below:

In the Claims

Claim 7, Line 1, delete "of claim 5"

Claim 9, Line 1, delete "of claim 5"

Claim 11, Line 1, delete "of claim 5"

Signed and Sealed this
Fifth Day of September, 2017

Joseph Matal
*Performing the Functions and Duties of the*
*Under Secretary of Commerce for Intellectual Property and*
*Director of the United States Patent and Trademark Office*